(12) United States Patent
Mirkin et al.

(10) Patent No.: US 9,971,239 B2
(45) Date of Patent: May 15, 2018

(54) SILICA POLYMER PEN LITHOGRAPHY

(71) Applicant: NORTHWESTERN UNIVERSITY, Evanston, IL (US)

(72) Inventors: Chad A. Mirkin, Wilmette, IL (US); Keith A. Brown, Newton, MA (US); James L. Hedrick, III, Evanston, IL (US)

(73) Assignee: NORTHWESTERN UNIVERSITY, Evanston, IL (US)

( * ) Notice: Subject to any disclaimer, the term of this patent is extended or adjusted under 35 U.S.C. 154(b) by 1 day.

(21) Appl. No.: 15/299,565

(22) Filed: Oct. 21, 2016

(65) Prior Publication Data

US 2017/0115558 A1   Apr. 27, 2017

Related U.S. Application Data

(60) Provisional application No. 62/245,070, filed on Oct. 22, 2015.

(51) Int. Cl.
*G03F 7/00* (2006.01)
*C23C 16/40* (2006.01)

(52) U.S. Cl.
CPC .......... *G03F 7/0002* (2013.01); *C23C 16/402* (2013.01)

(58) Field of Classification Search
None
See application file for complete search history.

(56) References Cited

U.S. PATENT DOCUMENTS

| | | | |
|---|---|---|---|
| 5,472,881 A | 12/1995 | Beebe et al. | |
| 5,776,748 A | 7/1998 | Singhvi et al. | |
| 5,846,909 A | 12/1998 | McDevitt et al. | |
| 5,942,397 A | 8/1999 | Tarlov et al. | |
| 6,500,549 B1 | 12/2002 | Deppisch et al. | |
| 6,596,346 B2 | 7/2003 | Bernard et al. | |
| 2004/0228962 A1 | 11/2004 | Liu et al. | |
| 2011/0165329 A1 | 7/2011 | Mirkin et al. | |

FOREIGN PATENT DOCUMENTS

| WO | WO-99/48682 A1 | 9/1999 |
|---|---|---|
| WO | WO-09/132321 A1 | 10/2009 |

OTHER PUBLICATIONS

Allara et al., Spontaneously organized molecular assemblies. 1. Formation, dynamics and physical properties of n-Alkanoic acids adsorbed from solution on an oxidized aluminum surface, *Langmuir*, 1: 45 (1985).

Allara et al., The study of the gas-solid interaction of acetic acid with a cuprous oxide surface using reflection-absorption spectroscopy, *J. Colloid Interface Sci.*, 49: 410-21 (1974).

Anwander et al., Surface characterization and functionalization of MCM-41 silicas via silazane silylation, *J. Phys. Chem. B*, 104:3532-44 (2000).

Bain, A new class of self-assembled monolayers: organic thiols on gallium arsenide, *Adv. Mater.*, 4:591-4 (1992).

Bansal et al., Electrochemical properties of (111)-oriented n-Si surfaces derivatized with covalently-attached alkyl chains, *J. Phys. Chem. B*, 102:1067-70 (1998).

(Continued)

*Primary Examiner* — Joshua D Zimmerman

(74) *Attorney, Agent, or Firm* — Marshall, Gerstein & Borun LLP

(57) ABSTRACT

Provided here are hard transparent polymer pen arrays, methods of printing indicia using the same, and methods of preparing the same.

20 Claims, 5 Drawing Sheets

(56) References Cited

OTHER PUBLICATIONS

Bansal et al., Stabilization of Si photoanodes in aqueous electrolytes through surface alkylation, J. Phys. Chem. B., 102:4058-60 (1998).
Bernard et al., Printing patterns of proteins, Langmuir, 14:2225-9 (1998).
Bishop et al., Self-assembled monolayers: Recent developments and applications, Curr. Opin. Colloid & Interface Sci., 1:127-36 (1996).
Brazdil et al. Resonance raman spectra of adsorbed species at solid-gas interfaces. 2. Y-Nitrosodimethylaniline and Y-Dimethylaminoazobenzene adsorbed on semiconductor oxide surfaces, J. Phys. Chem., 85, 1005-14 (1981).
Burwell Modified silica gels as adsorbents and catalysts, Chemical Technology, 4, 370-7 (1974).
Calvert, Lithographic patterning of self-assembled films, J. Vac. Sci. Technol. B, 11:2155 (1993).
Chang et al., Structures of self-assembled monolayers of aromatic-derivatized thiols on evaporated gold and silver surfaces: implication on packing mechanism, J. Am. Chem. Soc., 116, 6792-805 (1994).
Chen et al., Do alkanethiols adsorb onto the surfaces of Tl—Ba—Ca—Cu—O-based high-temperature superconductors? The critical role of H20 content on the adsorption process, Langmuir, 12:2622-4 (1996).
Chen et al., Surveying the surface coordination chemistry of a superconductor: spontaneous adsorption of monolayer films of redox-active "ligands" on $YBa_2$—$Cu_3O_7$-σ, J. Am. Chem. Soc., 117:6374-5 (1995).
Chen et al., Synthesis and characterization of carboxylate-modified gold nanoparticle powders dispersible in water, Langmuir, 15:1075-82 (1999).
Chidsey, Book of Abstracts, 214th ACS National Meeting, Las Vegas, Nev., Sep. 7-11, 1997, I&EC-027.
Dammel, Diazonaphthoquinone Based Resists, 1st ed., SPIE Optical Engineering Press, Bellingham, Wash. (1993).
Donzel et al., Hydrophilic poly(dimethylsiloxane) stamps for microcontact printing, Adv. Mater., 13(15): 1164-7 (2001).
Dubois et al., Synthesis, structure, and properties of model organic surfaces, Phys. Chem., 43:437-63 (1992).
Ellison et al., Adsorption of Phenyl Isothiocyanate on Si(001): A 1,2-Dipolar Surface Addition Reaction, J. Phys. Chem. B, 103:6243-51 (1999).
Ellison et al., Cycloaddition Chemistry on Silicon(001) Surfaces: The Adsorption of Azo-tert-butane, J. Phys. Chem. B, 102:8510-8 (1998).
Eltekova et al., Adsorption of aromatic compounds from solutions on titanium dioxide and silica, Langmuir, 3:951-7 (1987).
Fenter et al., Structure of $CH_3(CH_2)17SH$ self-assembled on the Ag(111) surface: an incommensurate monolayer, Langmuir, 7, 2013-16 (1991).
Grabar et al., Preparation and characterization of Au colloid monolayers, Anal Chem, 67 : 735-43 (1995).
Gu et al., Electron tunneling at the semiconductor-insulator-electrolyte interface. Photocurrent studies of the n-InP-alkanethiol-ferrocyanide system, J. Phys. Chem. B, 102:9015-28 (1998).
Gui et al., Adsorption and surface structural chemistry of thiophenol, benzyl mercaptan, and alkyl mercaptans. Comparative studies at Ag(111) and Pt(111) electrodes by means of auger spectroscopy, electron energy loss spectroscopy, low-energy election diffraction, and electrochemistry, Langmuir, 7, 955-63 (1991).
Hamers et al., Formation of Ordered, Anisotropic Organic Monolayers on the Si(001) Surface, J. Phys. Chem. B, 101:1489-92 (1997).
He et al., Preparation of Hydrophilic Poly(dimethylsiloxane) Stamps by Plasma-Induced Grafting, Langmuir, 19(17):6982-6 (2003).
Hedrick et al., Hard transparent arrays for polymer pen lithography, ACS Nano, 10:3144-8 (2016).
Henderson et al., Self-assembled monolayers of ithiols, diisocyanides, and isocyanothiols on gold: "chemically sticky" surfaces for covalent attachment of metal clusters and studies of interfacial electron transfer, Inorg. Chim. Acta, 242:115-24 (1996).
Hickman et al., "Combining spontaneous molecular assembly with microfabrication to pattern surfaces: selective binding of isonitriles to platinum microwires and characterization by electrochemistry and surface spectroscopy", J. Am. Chem. Soc., 111: 7271-7272 (1989).
Hickman et al., Toward orthogonal self-assembly of redox active molecules on Pt and Au: selective reaction of disulfide with Au and isocyanide with Pt, Langmuir, 8, 357-9 (1992).
Hovis et al., Cycloaddition chemistry and formation of ordered organic monolayers on silicon (001) surfaces, Surf. Sci., 402-404:1-7 (1998).
Hovis et al., Cycloaddition Chemistry of 1,3-Dienes on the Silicon(001) Surface: Competition between [4+2] and [2+2] Reactions, J. Phys. Chem. B, 102:6873-9 (1998).
Hovis et al., Structure and bonding of ordered organic monolayers of 1,5-cyclooctadiene on the silicon(001) surface, J. Phys. Chem. B, 101:9581-5 (1997).
Hubbard, Electrochemistry of well-defined surfaces, Acc. Chem. Res., 13:177-84 (1980).
Huc et al., Self-assembled mono- and multilayers on gold from 1,4-diisocyanobenzene and ruthenium phthalocyanine, J. Phys. Chem. B, 103: 10489-95 (1999).
Huo et al., Polymer pen lithography, Science, 321(5896): 1658-60 (2008).
Iler, The Chemistry of Silica, Chapter 6, New York: Wiley (1979).
James et al., Patterned protein layers on solid substrates by thin stamp microcontact printing, Langmuir, 14, 741-4 (1998).
Laibinis et al., f-Terminated alkanethiolate monolayers on surfaces of copper, silver, and gold have similar wettabilities, J. Am. Chem. Soc., 114, 1990-5 (1992).
Laibinis et al., Comparisons of self-assembled monolayers on silver and gold: mixed monolayers derived from $HS(CH2)21X$ and $Hs(CH2)10Y$ (X, Y=$CH3$, $CH2OH$) have similar properties, Langmuir, 7:3167-73 (1991).
Lee et al., Adsorption of ordered zirconium phosphonate multilayer films on silicon and gold surfaces, J. Phys. Chem., 92 : 2597-601 (1988).
Li et al., Achieving λ/20 resolution by one-color initiation and deactivation of polymerization, Science, 324:910-3 (2009).
Li et al., Self assembly of n-Alkanethiolate monolayers on silver nano-structures: determination of the apparent thickness of the monolayer by scanning tunneling microscopy, Office of Naval Research, Technical Report No. 2, 24 pp (1994).
Lo et al., Polypyrrole growth on YBa2Cu3O7-L modified with a self-assembled monolayer of N-(3-aminopropyl)pyrrole: hardwiring the "electroactive hot spots" on a superconductor electrode, J. Am. Chem. Soc., 118:11295-6 (1996).
Lunt et al., Chemical studies of the passivation of GaAs surface recombination using sulfides and thiols, J. Appl. Phys., 70:7449-67 (1991).
Lunt et al., Passivation of GaAs surface recombination with organic thiols, J. Vacuum Sci. Technol. B, 9:2333-6 (1991).
Magallon et al., Structural characterization of n-alkyl amine monolayers on copper by ellipsometry and infrared spectroscopy, IN: Book of Abstracts of 215th ACS National Meeting, Dallas, Texas, Mar. 29-Apr. 2, 1998, Abstract No. 048.
Maoz et al., Penetration-controlled reactions in organized monolayer assemblies. 1. Aqueous permanganate interaction with monolayer and multilayer films of long-chain surfactants, Langmuir, 3:1034-44 (1987).
Maoz et al., Penetration-controlled reactions in organized monolayers assemblies. 2. Aqueous permanganate interaction with self-assembling monolayers of long-chain surfactants, Langmuir, 3:1045-51 (1987).
Martin et al., Direct protein microarray fabrication using a hydrogel "stamper", Langmuir, 14(15):3971-5 (1998).
Matteucci et al., Synthesis of deoxyoligonucleotides on a polymer support, J Am Chem Soc,103:3185-91 (1981).

(56) References Cited

OTHER PUBLICATIONS

Mayya et al., A study of the partitioning of colloidal particles based on their size during electrostatic immobilization at the air-water interface using fatty amine monolayers, J. Phys. Chem. B, 101, 9790-3 (1997).
Menzel et al., Surface-confined nanoparticles as substrates for photopolymerizable self-assembled monolayers, *Adv. Mater.*, 11:131-4 (1999).
Meyer et al., Evidence for adduct formation at the semiconductor-gas interface. Photoluminescent properties of cadmium selenide in the presence of amines, *J. Am. Chem. Soc.*, 110: 4914-18 (1988).
Mirkin et al., Controlling the surface properties of high temperature superconductors, *Adv. Mater.*, 9:167-73 (1997).
Mirkin, The power of the pen: development of massively parallel dip-pen nanolithography, *ACS Nano*, 1:79-83 (2007).
Nakagawa et al., GaAs interfaces with octadecyl thiol self-assembled monolayer: structural and electrical properties, *Japan J. Appl. Phys. Part 1*, 30:3759-62 (1991).
Nania et al., Frontal vitrification of PDMS using air plasma and consequences for surface wrinkling, Soft Matter, 11:3067-75 (2015).
Nuzzo et al., Spontaneously organized molecular assemblies. 3. Preparation and properties of solution adsorbed monolayers of organic disulfides on gold surfaces, *J Am Chem Soc*, 109:2358-2368 (1987).
Ohno et al., Nanostructural formation of self-assembled monolayer films on cleaved AlGaAs/GaAs heterojuctions, Mol. Crystal Liq. Crystal Sci. Technol. A, 295:189-92 (1997).
Patil et al., Surface derivatization of colloidal silver particles using interdigitized bilayers: a novel strategy for electrostatic immobilization of colloidal particles in thermally evaporated fatty acid/fatty amine films, *Langmuir*, 14, 2707-11 (1998).
Pereira et al., Modification of surface properties of alumina by plasma treatment, *J. Mater. Chem.*, 10, 259-61 (2000).
Porter et al., Gold and silver nanoparticles functionalized by the adsorption of dialkyl disulfides, *Langmuir*, 14, 7378-86 (1998).
Reuter et al., Effects of gallium arsenide passivation on scanning tunneling microscope excited luminescence, IN: Mater. Res. Soc. Symposium Proceedings, 380:119-24 (1995).
Sangiorgi et al., Adsorption of 1-decylamine on copper, Gazz. Chim. Ital., 111: 99-102 (1981).
Schmid et al., Siloxane polymers for high-resolution, high-accuracy soft lithography, 33:3042-9 (2000).
Sheen et al., A new class of organized self-assembled monolayers: alkane thiols on GaAs, J. Am. Chem. Soc., 114:1514-15 (1992).
Shim et al., Hard-tip, soft-spring lithography, Nature, 469(7331):516-20 (2011).
Slavov et al., Mechanism of silation of silica with hexamethyldisilazane, *J. Phys. Chem. B*, 104:983-9 (2000).
Solomun et al., On the promoting effect of alkali metals on the adsorption of nitriles on the gold(100) surface, Ber. Bunsen-Ges. Phys. Chem., 95:95-8 (1991).

Solomun et al., The interaction of nitriles with a potassium-promoted gold(100) surface, J. Phys. Chem., 95:10041-9 (1991).
Son et al., Adsorption of 4-methoxybenzyl cyanide on silver and gold surfaces investigated by fourier transform infrared spectroscopy, *J. Phys. Chem.*, 98:8488-93 (1994).
Song, Quenching of porous silicon photoluminescence by aromatic molecules, and surface derivatization of porous silicon with dimethyl sulfoxide, aryllithium, or alkyllithium reagents, Doctor of Philosophy in ChemistryThesis, University of California at San Diego (1998).
Soriaga et al., "Determination of the orientation of aromatic molecules adsorbed on platinum electrodes. The effect of solute concentration", *J Am Chem Soc*, 104:3937-45 (1982).
Steiner et al., Adsorption of alkanenitriles and alkanedinitriles on gold and copper, *Langmuir*, 8, 2771-7 (1992).
Steiner et al., Adsorption of NPh3, PPh3, AsPh3, SbPh3, and BiPh3 on gold and copper, *Langmuir*, 8, 90-4 (1992).
Tao, Structural comparison of self-assembled monolayers of n-alkanoic acids on the surfaces of silver, copper, and aluminum, *J. Am. Chem. Soc.*, 115:4350-8 (1993).
Timmons et al., "Investigation of fatty acid monolayers on metals by contact potential measurements", *J Phys Chem*, 69:984-990 (1965).
Ulman, An Introduction to Ultrathin Organic Films: From Langmuir-Blodgett to Self-Assembly, Boston: Academic Press (1991).
Ulman, Formation and Structure of Self-Assembled Monolayers, *Chem. Rev.*, 96:1533-54 (1996).
Walczak et al., Structure and interfacial properties of spontaneously adsorbed n-alkanethiolate monolayers on evaporated silver surfaces, *J. Am. Chem. Soc.*, 113:2370-8 (1991).
Wang et al., Scanning probe contact printing, Langmuir, 19:8951-5 (2003).
Wasserman et al., "Structure and reactivity of alkylsiloxane monolayers formed by reaction of alkyltrichlorosilanes on silicon substrates", *Langmuir*, 5:1074-1087 (1989).
Whitesides, Proceedings of the Robert A. Welch Foundation 39th Conference on Chemical Research Nanophase Chemistry, Houston, Texas, pp. 109-121 (1995).
Xia et al., Soft Lithography, *Angew. Chem. Int. Ed.*, 37:550-75 (1998).
Xie et al., Polymer pen lithography using dual-elastomer tip arrays, Small, 8(17):2664-9 (2012).
Xu et al., Surface coordination chemistry of YBa2Cu3O7-L, *Langmuir*, 14:6505-11 (1998).
Yamamoto et al., Characterization of the surface to thiol bonding in self-assembled monolayer films of C12H25SH on InP (100) by angle-resolved X-ray photoelectron spectroscopy, Langmuir, 15:8640-4 (1999).
Yonezawa et al., Layered nanocomposite of close-packed gold nanoparticles and TiO2 gel layers, *Chem. Mater.*, 11:33-5 (1999).
Zhang et al., Dip pen nanolithography stamp tip, Nano Lett., 4(9):1649-55 (2004).

US 9,971,239 B2

SILICA POLYMER PEN LITHOGRAPHY

STATEMENT OF GOVERNMENT SUPPORT

This invention was made with government support under FA9550-12-1-0141 and FA9550-12-1-0280 awarded by the Air Force Office of Scientific Research. The government has certain rights in the invention.

BACKGROUND

Polymer pen lithography (PPL) was developed to address the challenge of depositing soft materials over large areas with nanoscale resolution. It is a cantilever-free technique that relies upon an array of elastomeric pyramidal pens, held in a plane by an elastomeric common substrate on a rigid support, to deposit nanoscale features in a massively parallel format across centimeter-scale areas. When each pen comes into contact with a surface to be patterned, it deforms in a manner that can be conceptually separated into (1) a tip deformation that increases the tip—sample contact area and (2) a support deformation that does not change the tip—sample contact area. While the increase of contact area upon deformation is useful as a means to vary feature size, it limits the minimum achievable feature size and sensitizes patterning to variations in pen array height. As a result, the minimum feature size achieved by PPL is larger than the smallest features written by its cantilever-based predecessor dip-pen nanolithography (DPN) by a factor of about 3. The dependence of feature size on tip—sample force further limits pattern uniformity because of (1) uncertainty in knowing the tip—sample height and (2) variation of tip height across the array. While both of these factors are reported to be under about 250 nm, there is nearly a 1:1 relationship between extension and feature size, so this effect can be quite significant when considering the desire to write large scale arrays of submicrometer features.

If the elastomeric pens are replaced with rigid silicon pens (while retaining the elastomeric backing film), force-independent patterning is possible. This technique, known as hard-tip, soft-spring lithography (HSL), offers an 8 µm range in extension over which the feature size does not change. The drawback to HSL is that making each pen array consumes a specialty 50 µm thick Si wafer, in contrast to PPL which utilizes pen arrays that can be molded nearly indefinitely from a single Si mold. Additionally, HSL pens are not transparent, which precludes their use for patterning with energy via optical methods. Other noteworthy attempts to improve resolution of PPL have relied on using pen arrays composed of other polymers or hard polymer pens on a soft elastomer support. These approaches reduce the feature size dependence on force by at most a quarter, but none have produced extension-independent patterning.

Thus, a need exists for a tip array and method of patterning that allows for printing with high resolution in an extension-independent manner using transparent pen arrays that are simple modifications of inexpensive PPL pen arrays.

SUMMARY

Provided herein are tip arrays comprising a plurality of tips fixed to a common substrate layer and a rigid support, the tips and common substrate layer formed from an elastomeric polymer, the elastomeric polymer of the tips having a compression modulus of about 10 MPa to about 300 MPa, each tip having a radius of curvature of less than about 1 µm, and each tip coated with silica having a thickness of 125 nm to 200 nm.

Further provided herein are methods of sub-micron scale printing of indicia on a substrate using the disclosed tip arrays.

Also provided herein are methods of making tip arrays as disclosed herein.

DETAILED DESCRIPTION

Provided herein is a new cantilever-free pen array architecture that affords the ability to write with high resolution in an extension independent manner using transparent pen arrays that are only simple modification of conventional vanishingly cheap polymer pen lithography (PPL) pen arrays. The central hypothesis of this work is that by coating PPL pen arrays with a thin hard layer, the tip of each pyramid will retain its shape while strain due to tip-sample contact is absorbed by the much softer elastomeric layer. Specifically, coating PPL pen arrays composed of polydimethylsiloxane (PDMS) with silica using plasma-enhanced chemical vapor deposition (PE-CVD) is investigated. In particular, patterning with silica-coated PPL pen arrays, silica-coated polymer pen lithography (sPPL), is an effective way to pattern at high resolution without dependence on tip-sample contact force.

Figure 1:
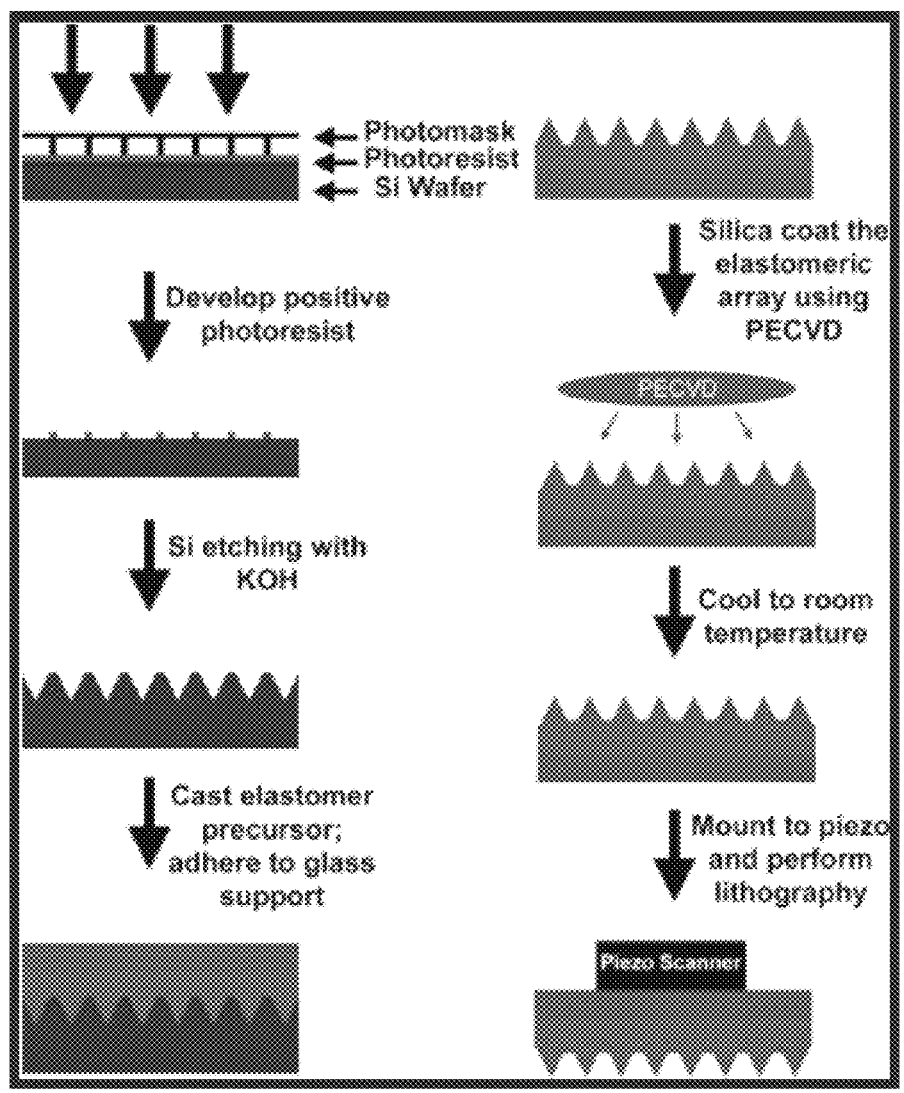
FIG. 1 shows the fabrication process for hard transparent polymer pen arrays as disclosed herein.
Figure 2:
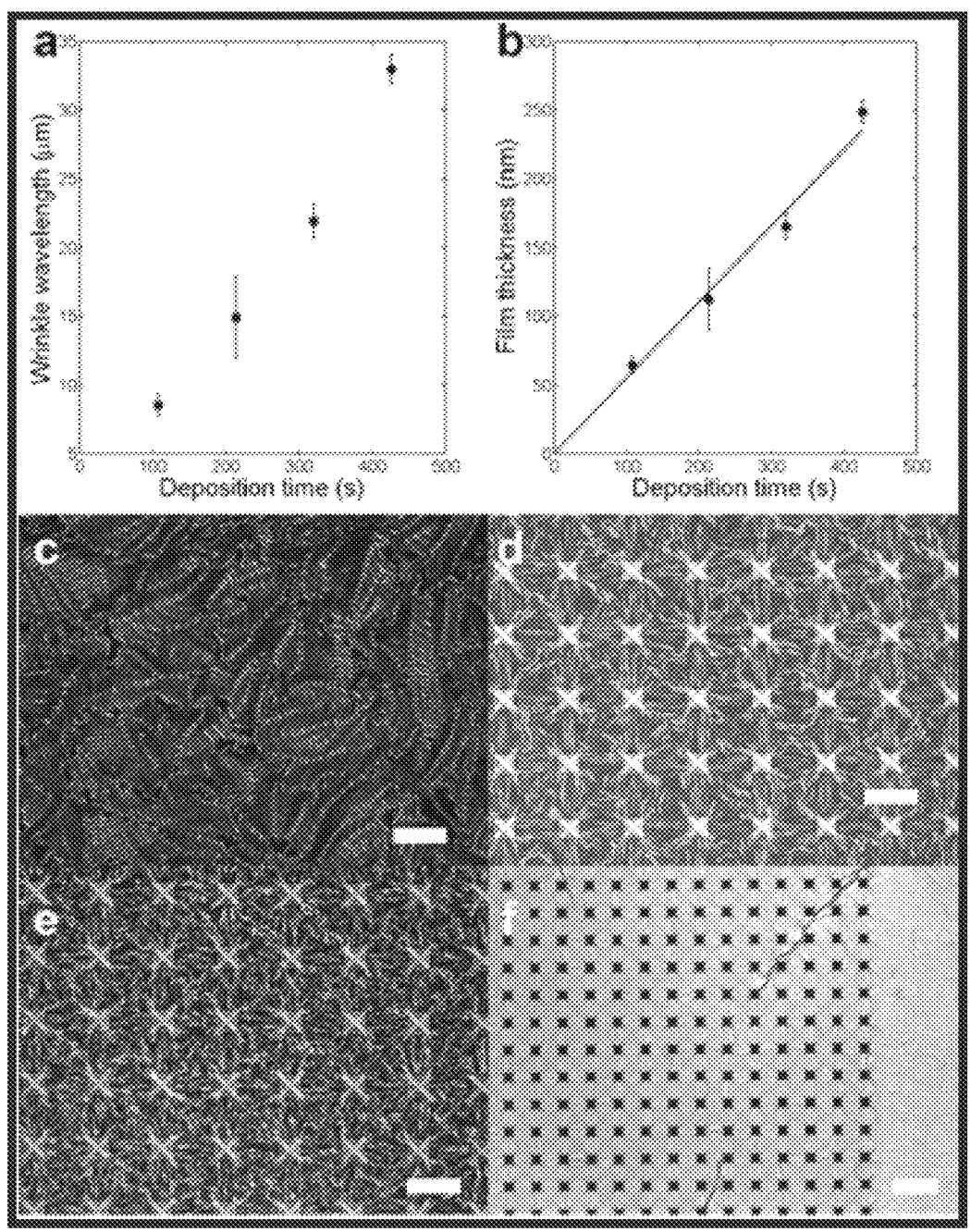
FIG. 2 shows (a) the wrinkle wavelength as a function of silica thickness; (b) silica thickness as a function of deposition time (slope 0.55±0.03 nm/s); (c) bright field image of silica deposited onto a slab of PDMS, 200 µm scale bar; (d) dark-field image of hard transparent array when it is at a thickness of 175 nm, 50 µm scale bar; (e) dark-field image of shattered hard transparent array tips after patterning when silica thickness is too thin at 83 nm, 50 µm scale bar; (f) bright-field image of hard transparent array when silica thickness is too large at 250 nm, where buckling is seen to go through the tips, 100 µm scale bar.

In principle, the presence of a conformal hard layer enables pen arrays to write in a consistently high resolution and extension independent manner. However, depositing a hard material on soft material is challenging and can often result in buckling and delamination. Thus, a low temperature PE-CVD procedure was developed to minimize the degree of thermal expansion that would lead to strain mismatch between the hard layer and the elastomeric pen array. Specifically, a deposition process at 200° C. (rather than 300° C. as typically used) at 900 mTorr while introducing 500 sccm $SH_4$ and 1420 sccm $O_2$ and 30 W of high frequency power was used. The fabrication process of the pen arrays is described in FIG. 1. By performing spectroscopic ellipsometry of test films grown on Si wafer chips, a growth rate of 0.92±0.01 nm/s with a refractive index at 630 nm of 1.49±0.01 was extracted, indicating a standard density silica film. More interestingly, while silica films grown on PDMS films could not be measured using ellipsometry due to the buckling pattern that emerged, this periodic array of buckles can be used to compute the film thickness, by assuming that the modulus of the silica film is the same as bulk silica (FIG. 2). Thus, it was inferred that the rate of deposition of silica on the PDMS surface is 0.55±0.03 nm/s FIG. 2 at (b)). It is interesting to note that exposing a PDMS film to an $O_2$ plasma has been noted to form a silica film with a thickness that grows linearly with exposure time. While this observation may explain the change in writing performance of PPL pen arrays following repeated exposure to $O_2$ plasma, this approach was found to generate silica layers impractically slow for our purposes.

In order to determine the optimal thickness of silica that would allow for extension independent patterning, PPL pen arrays coated with a series of thickness films were evaluated for their morphology and performance during tip-sample contact. Specifically, it was found that at low thicknesses (<100 nm), the force on the pens during contact with the substrate caused the thin silica layer to delaminate from the tip (FIG. 2 at (e)). In contrast, when the thickness was large (>250 nm), the buckling effect would be so great that it substantially deform the pyramids and perturb the uniformity of the pen array (FIG. 2 at (f)). As a result, a "goldilocks" regime was identified, where silica thicknesses of ~175 nm were a good compromise between the structural stability of the films and deformation of the pen array (FIG. 2 at (d)).

Figure 3:
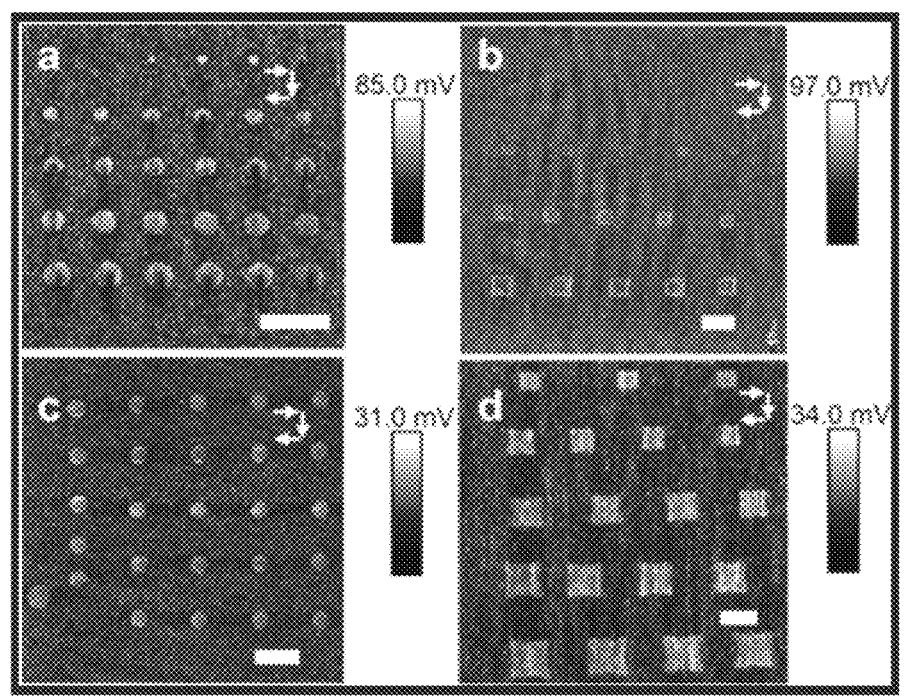
FIG. 3 shows the patterning of MHA using (a) a hard transparent array and (b) a polymer pen array, each with an extension sweep covering 5 µm piezo range with 1.5 µm/s extension and withdraw speed and no dwell time at full extension; patterning of MHA using (c) a hard transparent array and (d) a polymer pen array, with an extension sweep over 5 µm piezo range with 100 µm/s extension and withdraw speed and 5 s dwell time. All scale bars are 2.5 µm and the white arrows indicate the direction of patterning. Images were taken using lateral force microscopy.

In conventional PPL, the elastomeric composition of the pen array renders the feature size dependent on the tip-sample force. Specifically, as the force increases, the cross-sectional area of the tip in contact with the surface increases, resulting in a larger feature size. This is a limiting factor because of (1) uncertainty in knowing the tip-sample height and (2) variation of tip height across the array. While both of these factors are under ~250 nm, there is nearly a 1:1 relationship between extension and feature size, so this effect can be quite significant when considering large scale arrays of sub-micron features. In order to explore the force-dependent feature size of PPL vs. sPPL, 16-mercaptohexadecanoic acid (MHA), a molecule that is known to form a self-assembled monolayer on gold, was patterned. Features written by PPL were observed to be square and dependent on extension while features written only on tip-sample contact time, and not extension over the range 5 microns (FIG. 3 at (b) and (c)).

While in principle removing deformation-dependence will improve feature quality, deformable pens allow one to make macroscopic gradients by taking advantage of tilting the pen array with respect to the patterning surface. In order to regain this ability without extension-dependent patterning, simulating tilting the array to create a distribution of tip-sample distances through an extension sweep, and introducing a slow enough approach speed such that the variable height encodes for a variable tip-sample contact time was considered. Indeed, by extending across 5 µm and approaching at 1.5 microns/s gradients of features from 250 nm to 1 µm were created (FIG. 3 at (a) and (b)). This is an important process as it allows one to consider nanocombinatoric experiments with sPPL.

Figure 4:
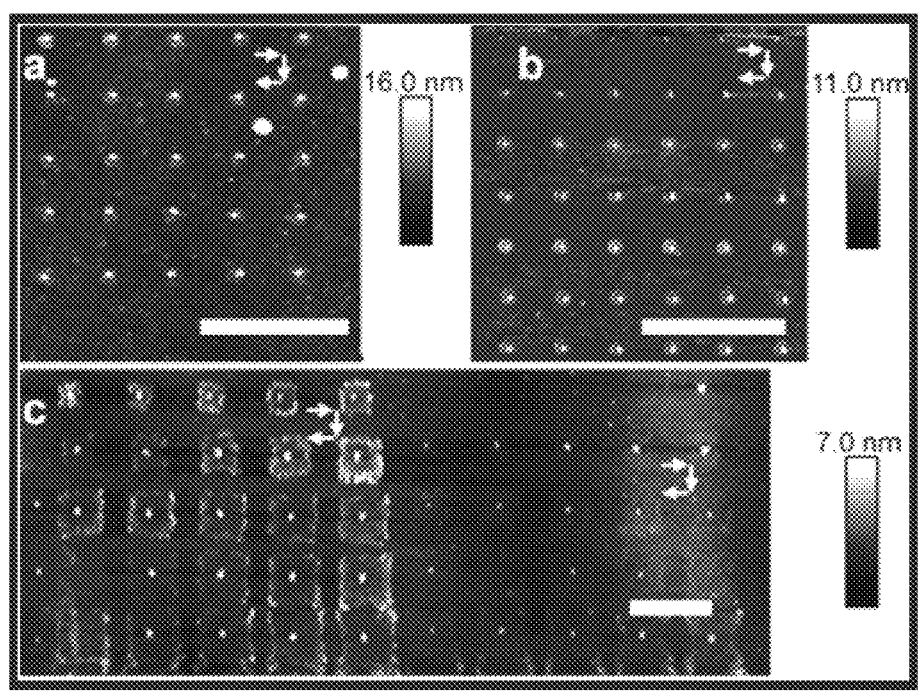
FIG. 4 shows the patterning of polymer ink with (a) a hard transparent array using an extension sweep over 5 µm piezo range with 100 µm/s extension and withdraw speed using hard transparent arrays and a dwell time of 2.5 s at full extension; (b) hard transparent array using an extension sweep over 4.2 µm piezo range with 3 µm/s extension and withdraw with no dwell time at full extension; (c) a polymer pen array using an extension sweep over 5 µm piezo range with the left half corresponding to the conditions of image (a) and the right half corresponding to conditions of image (b). The scale bars are 2.5 µm and the white arrows indicate the direction of patterning. The images were taken with AFM in tapping mode.
Figure 5:
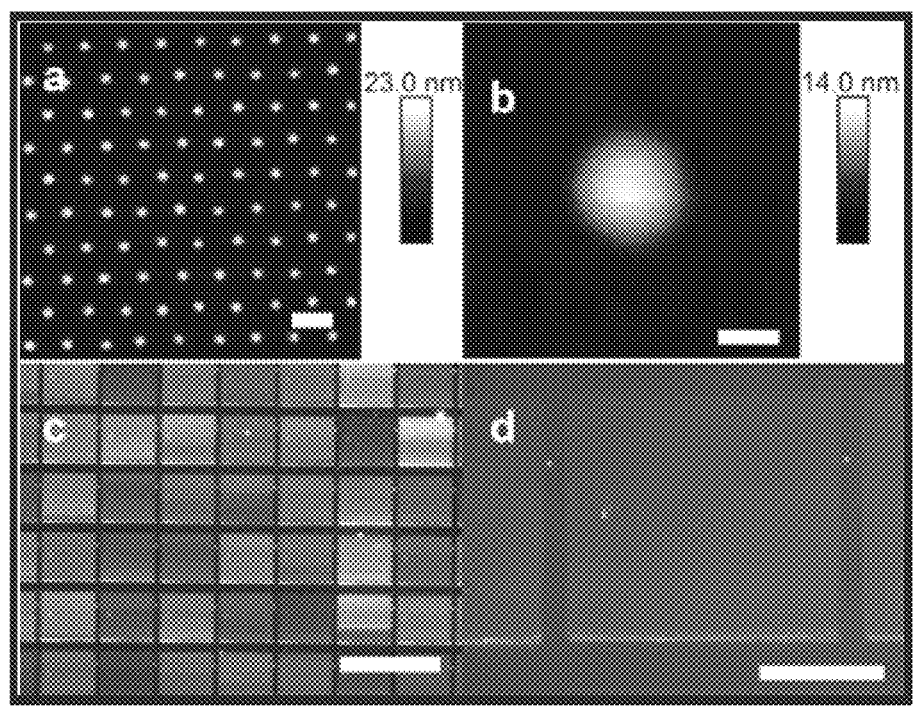
FIG. 5 shows the (a) AFM image of a dot array with a 190 nm pitch in a hexagonal pattern array written using hard transparent array, 200 nm scale bar; (b) single polymer feature with a circle of small droplets from original meniscus, 20 nm scale bar; (c) dark-field optical microscopy of array with 400 nm pitch written using hard transparent array with PPL with 14,641 features written per pen, 100 µm scale bar; and (d) a zoomed in image pattern made from a single pyramidal pen, 25 µm scale bar.

One major, and previously undiscussed limitation associated with tip deformation is that it can implicitly limit feature pitch. While covalently bound inks such as SAM-forming small molecules are robust after patterning, large molecule inks such as PEG behave as fluids and are disturbed after patterning because they still behave as fluids when kept in a high humidity environment of a patterning chamber. Because of this, if the tip-sample contact diameter is on the order of the feature pitch, the tip will perturb neighboring features when patterning. In PPL, this manifests as a row of features merging into a single large feature. To explore whether this effect is mitigated in the case of sPPL, the block copolymer poly(ethylene oxide)-block-poly(2-vinyl pyridine) (PEO-b-P2VP, Mn=2.8–b–1.5 kg·mol$^{-1}$) was patterned. Since the tips of sPPL pens do not deform when in contact with the surface, the meniscus size is expected to be smaller than in PPL, which means higher density patterns should be possible. This deformation limitation can be seen with square meniscus in PPL and circular meniscus for sPPL under AFM. Extension sweeps were used to confirm the ability to make size gradients. When extending across 4.2 µm and approaching at 3 µm/s, gradients of features from 40 nm to 160 nm were created (FIG. 4 at (b) and (c)). While no size gradients were made with sPPL when contact time with the substrate was constant and over a 5 µm extension range. It should be noted that because feature size is dependent on dwell time rather than extension, the density limitation does not greatly change when creating gradients. On the other hand, the large the gradient in PPL the larger the pitch needs to be. In this case a 5 µm pitch was needed in order to perform a 5 µm extension. PPL without any size gradients can get down to a pitch of 1 µm with P2VP-b-PEO based ink. On the other hand, sPPL is able to get down to densities of sub 175 nm with the same ink solution (FIG. 5 at (a) and (b)). With this sPPL can create large area high-density patterns. Here a 500 nm pitch array is provided which equates to 14,641 individual polymer dots per pen and 5.9 trillion polymer dots patterned when using a 2.25 in$^2$ sPPL array (FIG. 5 at (c) and (d)).

Cantilever-free scanning probe lithography is poised to become an important capability for rapidly performing nanocombinatoric experiments. In this work, it is shown how the use of silica-coated PPL pen arrays allows one to write higher density and reliability patterns than PPL alone with force independence but while retaining the ability to write gradients. Importantly, sPPL is a simple post-modification of PPL, indicating that the barrier to adoption is extremely small, unlike more complex methods of realizing hard tip cantilever-free systems. Combined with techniques like scanning probe block copolymer lithography, which utilizes P2VP-b-PEO and a metallic precursor to direct the on-site synthesis of metal nanoparticles, one can create high density nanoparticle arrays with potentially important implications for screening nanoparticle properties in areas such as plasmonics, nanomagnetics, and catalysis.

Tip Arrays

The lithography methods disclosed herein employ a tip array formed from elastomeric polymer material. The tip arrays are non-cantilevered and comprise tips which can be designed to have any shape or spacing between them, as needed. The shape of each tip can be the same or different from other tips of the array. Contemplated tip shapes include spheroid, hemispheroid, toroid, polyhedron, cone, cylinder, and pyramid (trigonal or square). The tips are sharp, so that they are suitable for forming submicron patterns, e.g., less than about 500 nm. The sharpness of the tip is measured by its radius of curvature, and the radius of curvature of the tips disclosed herein is below 1 µm and can be less than about 0.9 µm less than about 0.8 µm less than about 0.7 µm less than about 0.6 µm less than about 0.5 µm less than about 0.4 µm less than about 0.3 µm less than about 0.2 µm less than about 0.1 µm less than about 90 nm, less than about 80 nm, less than about 70 nm, less than about 60 nm, or less than about 50 nm.

The tip array can be formed from a mold made using photolithography methods, which is then used to fashion the tip array using a polymer as disclosed herein. The mold can be engineered to contain as many tips arrayed in any fashion desired. The tips of the tip array can be any number desired, and contemplated numbers of tips include about 1000 tips to about 15 million tips, or greater. The number of tips of the tip array can be greater than about 1 million, greater than about 2 million, greater than about 3 million, greater than about 4 million, greater than 5 million tips, greater than 6 million, greater than 7 million, greater than 8 million, greater than 9 million, greater than 10 million, greater than 11 million, greater than 12 million, greater than 13 million, greater than 14 million, or greater than 15 million tips.

The tips of the tip array can be designed to have any desired thickness, but typically the thickness of the tip array is about 50 nm to about 1 µm about 50 nm to about 500 nm, about 50 nm to about 400 nm, about 50 nm to about 300 nm, about 50 nm to about 200 nm, or about 50 nm to about 100 nm.

The polymers can be any polymer having a compressibility compatible with the lithographic methods. Polymeric materials suitable for use in the tip array can have linear or branched backbones, and can be crosslinked or non-crosslinked, depending upon the particular polymer and the degree of compressibility desired for the tip. Cross-linkers refer to multi-functional monomers capable of forming two or more covalent bonds between polymer molecules. Non-limiting examples of cross-linkers include such as trimethylolpropane trimethacrylate (TMPTMA), divinylbenzene, di-epoxies, tri-epoxies, tetra-epoxies, di-vinyl ethers, tri-vinyl ethers, tetra-vinyl ethers, and combinations thereof.

Thermoplastic or thermosetting polymers can be used, as can crosslinked elastomers. In general, the polymers can be porous and/or amorphous. A variety of elastomeric polymeric materials are contemplated, including polymers of the general classes of silicone polymers and epoxy polymers. Polymers having low glass transition temperatures such as, for example, below 25° C. or more preferably below −50° C., can be used. Diglycidyl ethers of bisphenol A can be used, in addition to compounds based on aromatic amine, triazine, and cycloaliphatic backbones. Another example includes Novolac polymers. Other contemplated elastomeric polymers include methylchlorosilanes, ethylchlorosilanes, and phenylchlorosilanes, polydimethylsiloxane (PDMS). Other materials include polyethylene, polystyrene, polybutadiene, polyurethane, polyisoprene, polyacrylic rubber, fluorosilicone rubber, and fluoroelastomers.

Further examples of suitable polymers that may be used to form a tip can be found in U.S. Pat. No. 5,776,748; U.S. Pat. No. 6,596,346; and U.S. Pat. No. 6,500,549, each of which is hereby incorporated by reference in its entirety. Other suitable polymers include those disclosed by He et al., *Langmuir* 2003, 19, 6982-6986; Donzel et al., *Adv. Mater.* 2001, 13, 1164-1167; and Martin et al., *Langmuir*, 1998, 14-15, 3791-3795. Hydrophobic polymers such as polydimethylsiloxane can be modified either chemically or physically by, for example, exposure to a solution of a strong oxidizer or to an oxygen plasma.

The polymer of the tip array has a suitable compression modulus and surface hardness to prevent collapse of the polymer during inking and printing, but too high a modulus and too great a surface hardness can lead to a brittle material that cannot adapt and conform to a substrate surface during printing. As disclosed in Schmid, et al., *Macromolecules*, 33:3042 (2000), vinyl and hydrosilane prepolymers can be tailored to provide polymers of different modulus and surface hardness. Thus, in some cases, the polymer is a mixture of vinyl and hydrosilane prepolymers, where the weight ratio of vinyl prepolymer to hydrosilane crosslinker is about 5:1 to about 20:1, about 7:1 to about 15:1, or about 8:1 to about 12:1.

The polymers of the tip array preferably will have a surface hardness of about 0.2% to about 3.5% of glass, as measured by resistance of a surface to penetration by a hard sphere with a diameter of 1 mm, compared to the resistance of a glass surface (as described in Schmid, et al., *Macromolecules*, 33:3042 (2000) at p 3044). The surface hardness can be about 0.3% to about 3.3%, about 0.4% to about 3.2%, about 0.5% to about 3.0%, or about 0.7% to about 2.7%. The polymers of the tip array can have a compression modulus of about 10 MPa to about 300 MPa. The tip array preferably comprises a compressible polymer which is Hookean under pressures of about 10 MPa to about 300 MPa. The linear relationship between pressure exerted on the tip array and the feature size allows for control of the indicia printed using the disclosed methods and tip arrays.

The tip array can comprise a polymer that has adsorption and/or absorption properties for the patterning composition, such that the tip array acts as its own patterning composition reservoir. For example, PDMS is known to adsorb patterning inks, see, e.g., US Patent Publication No. 2004/228962, Zhang, et al., *Nano Lett.* 4, 1649 (2004), and Wang et al., *Langmuir* 19, 8951 (2003).

The tip array further comprises a silica coating on the tips. The thickness of the silica coating is about 100 nm to about 250 nm, e.g., about 100 nm to about 200 nm, about 110 nm to about 230 nm, about 120 nm to about 220 nm, about 125 nm to about 200 nm, about 125 nm to about 190 nm, about 130 nm to about 180 nm, about 140 nm to about 180 nm, about 150 nm to about 180 nm, or about 110 nm, about 115 nm, about 120 nm, about 125 nm, about 130 nm, about 135 nm, about 140 nm, about 145 nm, about 150 nm, about 155 nm, about 160 nm, about 165 nm, about 170 nm, about 175 nm, about 180 nm, about 185 nm, about 190 nm, about 195 nm, about 200 nm, about 210 nm, about 220 nm, about 230 nm, about 240 nm, or about 250 nm. The silica coating can be applied through chemical vapor deposition (CVD), e.g., plasma enhanced CVD (PE-CVD). The CVD can be performed at a low temperature (e.g., about 200° C.) to avoid strain mismatch between the hard silica shell and the elastomeric polymer pen.

The tip array can comprise a plurality of tips fixed to a common substrate and formed from a polymer as disclosed herein. The tips can be arranged randomly or in a regular periodic pattern (e.g., in columns and rows, in a circular pattern, or the like). The tips can all have the same shape or be constructed to have different shapes. The common substrate can comprise an elastomeric layer, which can comprise the same polymer that forms the tips of the tip array, or can comprise an elastomeric polymer that is different from that of the tip array. The elastomeric layer can have a thickness of about 50 μm to about 100 μm. The tip array can be affixed or adhered to a rigid support (e.g., glass, such as a glass slide). In various cases, the common substrate, the tip array, and/or the rigid support, if present, is translucent or transparent. In a specific case, each is translucent or transparent. The thickness of combination of the tip array and common substrate, can be less than about 200 μm preferably less than about 150 μm or more preferably about 100 μm.

Leveling the Tip Array

The tip array as disclosed herein can be leveled to a substrate to be printed using a variety of means. One method of leveling is use of force feedback, as described in US 2011/165329, the disclosure of which is incorporated by reference in its entirety.

The tip array as disclosed herein can be leveled to the substrate to be printed using optical feedback, when the tip array is at least translucent. Optical feedback leveling is described in WO 09/132321, the disclosure of which is incorporated by reference in its entirety.

Patterning Compositions

Patterning compositions suitable for use in the disclosed methods include both homogeneous and heterogeneous compositions, the latter referring to a composition having more than one component. The patterning composition is coated on the tip array. The term "coating," as used herein, refers both to coating of the tip array as well adsorption and absorption by the tip array of the patterning composition. Upon coating of the tip array with the patterning composition, the patterning composition can be patterned on a substrate surface using the tip array.

Patterning compositions can be liquids, solids, semi-solids, and the like. Patterning compositions suitable for use include, but are not limited to, molecular solutions, polymer solutions, pastes, gels, creams, glues, resins, epoxies, adhesives, metal films, particulates, solders, etchants, and combinations thereof.

Patterning compositions can include materials such as, but not limited to, monolayer-forming species, thin film-forming species, oils, colloids, metals, metal complexes, metal oxides, ceramics, organic species (e.g., moieties comprising a carbon-carbon bond, such as small molecules, polymers, polymer precursors, proteins, antibodies, and the like), polymers (e.g., both non-biological polymers and biological polymers such as single and double stranded DNA, RNA, and the like), polymer precursors, dendrimers, nanoparticles, and combinations thereof. In some embodiments, one or more components of a patterning composition includes a functional group suitable for associating with a substrate, for example, by forming a chemical bond, by an ionic interaction, by a Van der Waals interaction, by an electrostatic interaction, by magnetism, by adhesion, and combinations thereof.

In some embodiments, the composition can be formulated to control its viscosity. Parameters that can control ink viscosity include, but are not limited to, solvent composition, solvent concentration, thickener composition, thickener concentration, particles size of a component, the molecular weight of a polymeric component, the degree of cross-linking of a polymeric component, the free volume (i.e., porosity) of a component, the swellability of a component, ionic interactions between ink components (e.g., solvent-thickener interactions), and combinations thereof.

In some embodiments, the patterning composition comprises an additive, such as a solvent, a thickening agent, an ionic species (e.g., a cation, an anion, a zwitterion, etc.) the concentration of which can be selected to adjust one or more of the viscosity, the dielectric constant, the conductivity, the tonicity, the density, and the like.

Suitable thickening agents include, but are not limited to, metal salts of carboxyalkylcellulose derivatives (e.g., sodium carboxymethylcellulose), alkylcellulose derivatives (e.g., methylcellulose and ethylcellulose), partially oxidized alkylcellulose derivatives (e.g., hydroxyethylcellulose, hydroxypropylcellulose and hydroxypropylmethylcellulose), starches, polyacrylamide gels, homopolymers of poly-N-vinylpyrrolidone, poly(alkyl ethers) (e.g., polyethylene oxide, polyethylene glycol, and polypropylene oxide), agar, agarose, xanthan gums, gelatin, dendrimers, colloidal silicon dioxide, lipids (e.g., fats, oils, steroids, waxes, glycerides of fatty acids, such as oleic, linoleic, linolenic, and arachidonic acid, and lipid bilayers such as from phosphocholine) and combinations thereof. In some embodiments, a thickener is present in a concentration of about 0.5% to about 25%, about 1% to about 20%, or about 5% to about 15% by weight of a patterning composition.

Suitable solvents for a patterning composition include, but are not limited to, water, C1-C8 alcohols (e.g., methanol, ethanol, propanol and butanol), C6-C12 straight chain, branched and cyclic hydrocarbons (e.g., hexane and cyclohexane), C6-C14 aryl and aralkyl hydrocarbons (e.g., benzene and toluene), C3-C10 alkyl ketones (e.g., acetone), C3-C10 esters (e.g., ethyl acetate), C4-C10 alkyl ethers, and combinations thereof. In some embodiments, a solvent is present in a concentration of about 1% to about 99%, about 5% to about 95%, about 10% to about 90%, about 15% to about 95%, about 25% to about 95%, about 50% to about 95%, or about 75% to about 95% by weight of a patterning composition.

Patterning compositions can comprise an etchant. As used herein, an "etchant" refers to a component that can react with a surface to remove a portion of the surface. Thus, an etchant is used to form a subtractive feature by reacting with a surface and forming at least one of a volatile and/or soluble material that can be removed from the substrate, or a residue, particulate, or fragment that can be removed from the substrate by, for example, a rinsing or cleaning method. In some embodiments, an etchant is present in a concentration of about 0.5% to about 95%, about 1% to about 90%, about 2% to about 85%, about 0.5% to about 10%, or about 1% to about 10% by weight of the patterning composition.

Etchants suitable for use in the methods disclosed herein include, but are not limited to, an acidic etchant, a basic etchant, a fluoride-based etchant, and combinations thereof. Acidic etchants suitable for use with the present invention include, but are not limited to, sulfuric acid, trifluoromethanesulfonic acid, fluorosulfonic acid, trifluoroacetic acid, hydrofluoric acid, hydrochloric acid, carborane acid, and combinations thereof. Basic etchants suitable for use with the present invention include, but are not limited to, sodium hydroxide, potassium hydroxide, ammonium hydroxide, tetraalkylammonium hydroxide ammonia, ethanolamine, ethylenediamine, and combinations thereof. Fluoride-based etchants suitable for use with the present invention include, but are not limited to, ammonium fluoride, lithium fluoride, sodium fluoride, potassium fluoride, rubidium fluoride, cesium fluoride, francium fluoride, antimony fluoride, calcium fluoride, ammonium tetrafluoroborate, potassium tetrafluoroborate, and combinations thereof.

In some embodiments, the patterning composition includes a reactive component. As used herein, a "reactive component" refers to a compound or species that has a chemical interaction with a substrate. In some embodiments, a reactive component in the ink penetrates or diffuses into the substrate. In some embodiments, a reactive component transforms, binds, or promotes binding to exposed functional groups on the surface of the substrate. Reactive components can include, but are not limited to, ions, free radicals, metals, acids, bases, metal salts, organic reagents, and combinations thereof. Reactive components further include, without limitation, monolayer-forming species such as thiols, hydroxides, amines, silanols, siloxanes, and the like, and other monolayer-forming species known to a person or ordinary skill in the art. The reactive component can be present in a concentration of about 0.001% to about 100%, about 0.001% to about 50%, about 0.001% to about 25%, about 0.001% to about 10%, about 0.001% to about 5%, about 0.001% to about 2%, about 0.001% to about 1%, about 0.001% to about 0.5%, about 0.001% to about 0.05%, about 0.01% to about 10%, about 0.01% to about 5%, about 0.01% to about 2%, about 0.01% to about 1%, about 10% to about 100%, about 50% to about 99%, about 70% to about 95%, about 80% to about 99%, about 0.001%, about 0.005%, about 0.01%, about 0.1%, about 0.5%, about 1%, about 2%, or about 5% weight of the patterning composition.

The patterning composition can further comprise a conductive and/or semi-conductive component. As used herein, a "conductive component" refers to a compound or species that can transfer or move electrical charge. Conductive and semi-conductive components include, but are not limited to, a metal, a nanoparticle, a polymer, a cream solder, a resin, and combinations thereof. In some embodiments, a conductive component is present in a concentration of about 1% to about 100%, about 1% to about 10%, about 5% to about 100%, about 25% to about 100%, about 50% to about 100%, about 75% to about 99%, about 2%, about 5%, about 90%, about 95% by weight of the patterning composition.

Metals suitable for use in a patterning composition include, but are not limited to, a transition metal, aluminum, silicon, phosphorous, gallium, germanium, indium, tin, antimony, lead, bismuth, alloys thereof, and combinations thereof.

In some embodiments, the patterning composition comprises a semi-conductive polymer. Semi-conductive polymers suitable for use with the present invention include, but are not limited to, a polyaniline, a poly(3,4-ethylenedioxythiophene)-poly(styrenesulfonate), a polypyrrole, an arylene vinylene polymer, a polyphenylenevinylene, a polyacetylene, a polythiophene, a polyimidazole, and combinations thereof.

The patterning composition can include an insulating component. As used herein, an "insulating component" refers to a compound or species that is resistant to the movement or transfer of electrical charge. In some embodiments, an insulating component has a dielectric constant of about 1.5 to about 8 about 1.7 to about 5, about 1.8 to about 4, about 1.9 to about 3, about 2 to about 2.7, about 2.1 to about 2.5, about 8 to about 90, about 15 to about 85, about 20 to about 80, about 25 to about 75, or about 30 to about 70. Insulating components suitable for use in the methods disclosed herein include, but are not limited to, a polymer, a metal oxide, a metal carbide, a metal nitride, monomeric precursors thereof, particles thereof, and combinations thereof. Suitable polymers include, but are not limited to, a polydimethylsiloxane, a silsesquioxane, a polyethylene, a polypropylene, a polyimide, and combinations thereof. In some embodiments, for example, an insulating component is present in a concentration of about 1% to about 95%, about 1% to about 80%, about 1% to about 50%, about 1% to about 20%, about 1% to about 10%, about 20% to about 95%, about 20% to about 90%, about 40% to about 80%, about 1%, about 5%, about 10%, about 90%, or about 95% by weight of the patterning composition.

The patterning composition can include a masking component. As used herein, a "masking component" refers to a compound or species that upon reacting forms a surface feature resistant to a species capable of reacting with the surrounding surface. Masking components suitable for use with the present invention include materials commonly employed in traditional photolithography methods as "resists" (e.g., photoresists, chemical resists, self-assembled monolayers, etc.). Masking components suitable for use in the disclosed methods include, but are not limited to, a polymer such as a polyvinylpyrollidone, poly(epichlorohydrin-co-ethyleneoxide), a polystyrene, a poly(styrene-co-butadiene), a poly(4-vinylpyridine-co-styrene), an amine terminated poly(styrene-co-butadiene), a poly(acrylonitrile-co-butadiene), a styrene-butadiene-styrene block copolymer, a styrene-ethylene-butylene block linear copolymer, a polystyrene-block-poly(ethylene-ran-butylene)-block-polystyrene, a poly(styrene-co-maleic anhydride), a polystyrene-block-poly(ethylene-ran-butylene)-block-polystyrene-graft-maleic anhydride, a polystyrene-block-polyisoprene-block-polystyrene, a polystyrene-block-poly(ethylene-ran-butylene)-block-polystyrene, a polynorbornene, a dicarboxy terminated poly(acrylonitrile-co-butadiene-co-acrylic acid), a dicarboxy terminated poly(acrylonitrile-co-butadiene), a polyethyleneimine, a poly(carbonate urethane), a poly(acrylonitrile-co-butadiene-co-styrene), a poly(vinylchloride), a poly(acrylic acid), a poly(methylmethacrylate), a poly(methyl methacrylate-co-methacrylic acid), a polyisoprene, a poly(1,4-butylene terephthalate), a polypropylene, a poly (vinyl alcohol), a poly(1,4-phenylene sulfide), a polylimonene, a poly(vinylalcohol-co-ethylene), a poly[N,N'-(1,3-phenylene)isophthalamide], a poly(1,4-phenylene ether-ether-sulfone), a poly(ethyleneoxide), a poly[butylene terephthalate-co-poly(alkylene glycol) terephthalate], a poly (ethylene glycol) diacrylate, a poly(4-vinylpyridine), a poly (DL-lactide), a poly(3,3',4,4'-benzophenonetetracarboxylic dianhydride-co-4,4'-oxydianiline/1,3-phenylenediamine), an agarose, a polyvinylidene fluoride homopolymer, a styrene butadiene copolymer, a phenolic resin, a ketone resin, a 4,5-difluoro-2,2-bis(trifluoromethyl)-1,3-dioxane, a salt thereof, and combinations thereof. In some embodiments, a masking component is present in a concentration of about 1% to about 10%, about 1% to about 5%, or about 2% by weight of the patterning composition.

The patterning composition can include a conductive component and a reactive component. For example, a reactive component can promote at least one of: penetration of a conductive component into a surface, reaction between the conductive component and a surface, adhesion between a conductive feature and a surface, promoting electrical contact between a conductive feature and a surface, and combinations thereof. Surface features formed by reacting this patterning composition include conductive features selected from the group consisting of: additive non-penetrating, additive penetrating, subtractive penetrating, and conformal penetrating surface features.

The patterning composition can comprise an etchant and a conductive component, for example, suitable for producing a subtractive surface feature having a conductive feature inset therein.

The patterning composition can comprise an insulating component and a reactive component. For example, a reactive component can promote at least one of: penetration of an insulating component into a surface, reaction between the insulating component and a surface, adhesion between an insulating feature and a surface, promoting electrical contact between an insulating feature and a surface, and combinations thereof. Surface features formed by reacting this patterning composition include insulating features selected from the group consisting of: additive non-penetrating, additive penetrating, subtractive penetrating, and conformal penetrating surface features.

The patterning composition can comprise an etchant and an insulating component, for example, suitable for producing a subtractive surface feature having an insulating feature inset therein.

The patterning composition can comprise a conductive component and a masking component, for example, suitable for producing electrically conductive masking features on a surface.

Other contemplated components of a patterning composition suitable for use with the disclosed methods include thiols, 1,9-Nonanedithiol solution, silane, silazanes, alkynes cystamine, N-Fmoc protected amino thiols, biomolecules, DNA, proteins, antibodies, collagen, peptides, biotin, and carbon nanotubes.

For a description of patterning compounds and patterning compositions, and their preparation and use, see Xia and Whitesides, Angew. Chem. Int. Ed., 37, 550-575 (1998) and references cited therein; Bishop et al., Curr. Opinion Colloid & Interface Sci., 1, 127-136 (1996); Calvert, J. Vac. Sci. Technol. B, 11, 2155-2163 (1993); Ulman, Chem. Rev., 96:1533 (1996) (alkanethiols on gold); Dubois et al., Annu. Rev. Phys. Chem., 43:437 (1992) (alkanethiols on gold); Ulman, An Introduction to Ultrathin Organic Films: From Langmuir-Blodgett to Self-Assembly (Academic, Boston, 1991) (alkanethiols on gold); Whitesides, Proceedings of the Robert A. Welch Foundation 39th Conference On Chemical Research Nanophase Chemistry, Houston, Tex., pages 109-121 (1995) (alkanethiols attached to gold); Mucic et al. Chem. Commun. 555-557 (1996) (describes a method of attaching 3' thiol DNA to gold surfaces); U.S. Pat. No. 5,472,881 (binding of oligonucleotide-phosphorothiolates to gold surfaces); Burwell, Chemical Technology, 4, 370-377 (1974) and Matteucci and Caruthers, J. Am. Chem. Soc., 103, 3185-3191 (1981) (binding of oligonucleotides-alkylsiloxanes to silica and glass surfaces); Grabar et al., Anal. Chem., 67, 735-743 (binding of aminoalkylsiloxanes and for similar binding of mercaptoalkylsiloxanes); Nuzzo et al., J. Am. Chem. Soc., 109, 2358 (1987) (disulfides on gold); Allara and Nuzzo, Langmuir, 1, 45 (1985) (carboxylic acids on aluminum); Allara and Tompkins, J. Colloid Interfate Sci., 49, 410-421 (1974) (carboxylic acids on copper); Iler, The Chemistry Of Silica, Chapter 6, (Wiley 1979) (carboxylic acids on silica); Timmons and Zisman, J. Phys. Chem., 69, 984-990 (1965) (carboxylic acids on platinum); Soriaga and Hubbard, J. Am. Chem. Soc., 104, 3937 (1982) (aromatic ring compounds on platinum); Hubbard, Acc. Chem. Res., 13, 177 (1980) (sulfolanes, sulfoxides and other functionalized solvents on platinum); Hickman et al., J. Am. Chem. Soc., 111, 7271 (1989) (isonitriles on platinum); Maoz and Sagiv, Langmuir, 3, 1045 (1987) (silanes on silica); Maoz and Sagiv, Langmuir, 3, 1034 (1987) (silanes on silica); Wasserman et al., Langmuir, 5, 1074 (1989) (silanes on silica); Eltekova and Eltekov, Langmuir, 3,951 (1987) (aromatic carboxylic acids, aldehydes, alcohols and methoxy groups on titanium dioxide and silica); and Lec et al., J. Phys. Chem., 92, 2597 (1988) (rigid phosphates on metals); Lo et al., J. Am. Chem. Soc., 118, 11295-11296 (1996) (attachment of pyrroles to superconductors); Chen et al., J. Am. Chem. Soc., 117, 6374-5 (1995) (attachment of amines and thiols to superconductors); Chen et al., Langmuir, 12, 2622-2624 (1996) (attachment of thiols to superconductors); McDevitt et al., U.S. Pat. No. 5,846,909 (attachment of amines and thiols to superconductors); Xu et al., Langmuir, 14, 6505-6511 (1998) (attachment of amines to superconductors); Mirkin et al., Adv. Mater. (Weinheim, Ger.), 9, 167-173 (1997) (attachment of amines to superconductors); Hovis et al., J. Phys. Chem. B, 102, 6873-6879 (1998) (attachment of olefins and dienes to silicon); Hovis et al., Surf. Sci., 402-404, 1-7 (1998) (attachment of olefins and dienes to silicon); Hovis et al., J. Phys. Chem. B, 101, 9581-9585 (1997) (attachment of olefins and dienes to silicon); Hamers et al., J. Phys. Chem. B, 101, 1489-1492 (1997) (attachment of olefins and dienes to silicon); Hamers et al., U.S. Pat. No. 5,908,692 (attachment of olefins and dienes to silicon); Ellison et al., J. Phys. Chem. B, 103, 6243-6251 (1999) (attachment of isothiocyanates to silicon); Ellison et al., J. Phys. Chem. B, 102, 8510-8518 (1998) (attachment of azoalkanes to silicon); Ohno et al., Mol. Cryst. Liq. Cryst. Sci. Technol., Sect. A, 295, 487-490 (1997) (attachment of thiols to GaAs); Reuter et al., Mater. Res. Soc. Symp. Proc., 380, 119-24 (1995) (attachment of thiols to GaAs); Bain, Adv. Mater. (Weinheim, Fed. Repub. Ger.), 4, 591-4 (1992) (attachment of thiols to GaAs); Sheen et al., J. Am. Chem. Soc., 114, 1514-15 (1992) (attachment of thiols to GaAs); Nakagawa et al., Jpn. J. Appl. Phys., Part 1, 30, 3759-62 (1991) (attachment of thiols to GaAs); Lunt et al., J. Appl. Phys., 70, 7449-67 (1991) (attachment of thiols to GaAs); Lunt et al., J. Vac. Sci. Technol., B, 9, 2333-6 (1991) (attachment ofthiols to GaAs); Yamamoto et al., Langmuir ACS ASAP, web release number Ia990467r (attachment of thiols to InP); Gu et al., J. Phys. Chem. B, 102, 9015-9028 (1998) (attachment of thiols to InP); Menzel et al., Adv. Mater. (Weinheim, Ger.), 11, 131-134 (1999) (attachment of disulfides to gold); Yonezawa et al., Chem. Mater., 11, 33-35 (1999) (attachment of disulfides to gold); Porter et al., Langmuir, 14, 7378-7386 (1998) (attachment of disulfides to gold); Son et al., J. Phys. Chem., 98, 8488-93 (1994) (attachment of nitriles to gold and silver); Steiner et al., Langmuir, 8, 2771-7 (1992) (attachment of nitriles to gold and copper); Solomun et al., J. Phys. Chem., 95, 10041-9 (1991) (attachment of nitriles to gold); Solomun et al., Ber. Bunsen-Ges. Phys. Chem., 95, 95-8 (1991) (attachment of nitriles to gold); Henderson et al., Inorg. Chim. Acta, 242, 115-24 (1996) (attachment of isonitriles to gold); Huc et al., J. Phys. Chem. B, 103, 10489-10495 (1999) (attachment of isonitriles to gold); Hickman et al., Langmuir, 8, 357-9 (1992) (attachment of isonitriles to platinum); Steiner et al., Langmuir, 8, 90-4 (1992) (attachment of amines and phospines to gold and attachment of amines to copper); Mayya et al., J. Phys. Chem. B, 101, 9790-9793 (1997) (attachment of amines to gold and silver); Chen et al., Langmuir, 15, 1075-1082 (1999) (attachment of carboxylates to gold); Tao, J. Am. Chem. Soc., 115, 4350-4358 (1993) (attachment of carboxylates to copper and silver);

Laibinis et al., J. Am. Chem. Soc., 114, 1990-5 (1992) (attachment of thiols to silver and copper); Laibinis et al., Langmuir, 7, 3167-73 (1991) (attachment of thiols to silver); Fenter et al., Langmuir, 7, 2013-16 (1991) (attachment of thiols to silver); Chang et al., Am. Chem. Soc., 116, 6792-805 (1994) (attachment of thiols to silver); Li et al., J. Phys. Chem., 98, 11751-5 (1994) (attachment of thiols to silver); Li et al., Report, 24 pp (1994) (attachment of thiols to silver); Tarlov et al., U.S. Pat. No. 5,942,397 (attachment of thiols to silver and copper); Waldeck, et al., PCT application WO/99/48682 (attachment of thiols to silver and copper); Gui et al., Langmuir, 7, 955-63 (1991) (attachment of thiols to silver); Walczak et al., J. Am. Chem. Soc., 113, 2370-8 (1991) (attachment of thiols to silver); Sangiorgi et al., Gazz. Chim. Ital., 111, 99-102 (1981) (attachment of amines to copper); Magallon et al., Book of Abstracts, 215th ACS National Meeting, Dallas, Mar. 29-Apr. 2, 1998, COLL-048 (attachment of amines to copper); Patil et al., Langmuir, 14, 2707-2711 (1998) (attachment of amines to silver); Sastry et al., J. Phys. Chem. B, 101, 4954-4958 (1997) (attachment of amines to silver); Bansal et al., J. Phys. Chem. B. 102, 4058-4060 (1998) (attachment of alkyl lithium to silicon); Bansal et al., J. Phys. Chem. B, 102, 1067-1070 (1998) (attachment of alkyl lithium to silicon); Chidsey, Book of Abstracts, 214th ACS National Meeting, Las Vegas, Nev., Sep. 7-11, 1997, I&EC-027 (attachment of alkyl lithium to silicon); Song, J. H., Thesis, University of California at San Diego (1998) (attachment of alkyl lithium to silicon dioxide); Meyer et al., J. Am. Chem. Soc., 110, 4914-18 (1988) (attachment of amines to semiconductors); Brazdil et al. J. Phys. Chem., 85, 1005-14 (1981) (attachment of amines to semiconductors); James et al., Langmuir, 14, 741-744 (1998) (attachment of proteins and peptides to glass); Bernard et al., Langmuir, 14, 2225-2229 (1998) (attachment of proteins to glass, polystyrene, gold, silver and silicon wafers); Pereira et al., J. Mater. Chem., 10, 259 (2000) (attachment of silazanes to $SiO_2$); Pereira et al., J. Mater. Chem., 10, 259 (2000) (attachment of silazanes to $SiO_2$); Dammel, Diazonaphthoquinone Based Resists (1st ed., SPIE Optical Engineering Press, Bellingham, Wash., 1993) (attachment of silazanes to $SiO_2$); Anwander et al., J. Phys. Chem. B, 104, 3532 (2000) (attachment of silazanes to $SiO_2$); Slavov et al., J. Phys. Chem., 104, 983 (2000) (attachment of silazanes to $SiO_2$).

Substrates to be Patterned

Substrates suitable for use in methods disclosed herein include, but are not limited to, metals, alloys, composites, crystalline materials, amorphous materials, conductors, semiconductors, optics, fibers, inorganic materials, glasses, ceramics (e.g., metal oxides, metal nitrides, metal silicides, and combinations thereof), zeolites, polymers, plastics, organic materials, minerals, biomaterials, living tissue, bone, films thereof, thin films thereof, laminates thereof, foils thereof, composites thereof, and combinations thereof. A substrate can comprise a semiconductor such as, but not limited to: crystalline silicon, polycrystalline silicon, amorphous silicon, p-doped silicon, n-doped silicon, silicon oxide, silicon germanium, germanium, gallium arsenide, gallium arsenide phosphide, indium tin oxide, and combinations thereof. A substrate can comprise a glass such as, but not limited to, undoped silica glass ($SiO_2$), fluorinated silica glass, borosilicate glass, borophosphorosilicate glass, organosilicate glass, porous organosilicate glass, and combinations thereof. The substrate can be a non-planar substrate, such as pyrolytic carbon, reinforced carbon-carbon composite, a carbon phenolic resin, and the like, and combinations thereof. A substrate can comprise a ceramic such as, but not limited to, silicon carbide, hydrogenated silicon carbide, silicon nitride, silicon carbonitride, silicon oxynitride, silicon oxycarbide, high-temperature reusable surface insulation, fibrous refractory composite insulation tiles, toughened unipiece fibrous insulation, low-temperature reusable surface insulation, advanced reusable surface insulation, and combinations thereof. A substrate can comprise a flexible material, such as, but not limited to: a plastic, a metal, a composite thereof, a laminate thereof, a thin film thereof, a foil thereof, and combinations thereof.

EXAMPLES

Materials: Polydimethylsiloxane was made from a 10 to 1 ratio of Slygard 184 from Dow Corning. 16-mercaptohexadecanoic acid (MHA), hexamethyldisilazane was obtained from Sigma Aldrich. Poly(ethylene oxide)-block-poly(2-vinyl pyridine) (PEO-b-P2VP, Mn=2.8–b–1.5 kg·$mol^{-1}$) was obtained from polymer source. 2 in glass slides were obtained at VWR.

Fabrication: Standard fabrication of PPL arrays as previously report. PPL array was then inserted into PECVD to be coated with Silica at 900 mTorr while introducing 500 sccm $SH_4$ and 1420 sccm $O_2$ and 30 W of high frequency power for 320 s with a base plate temperature of 200° C.

Ink preparation: 10 mM solution of MHA in ethanol and 5 mg/ml of P2VP-b-PEO in water was prepared. Silica-coated PPL array was plasma cleaned for 2 min under oxygen at 60 W. A 150 µl of either ink was spray coated onto the array using a Harder Steenbeck Infinity CR plus airbrush with a 0.15 mm needle and an Iwata Power Jet Pro IS-975 Dual Piston Compressor at 20 PSI airflow.

Substrate preparation: P2VP-b-PEO based ink was patterned on silicon wafers that had been vapor coated in a desiccator for 24 hours with hexamethyldisilazane to render it hydrophobic. MHA based ink was patterned onto silicon wafers that had 5 nm Ti followed by 35 nm Au deposited onto them by chemical vapor deposition using a Kurt J. Lesker Co. PVD 75 electron-beam evaporator.

Patterning: Patterning was performed with a Park XE-150 in a humidity control chamber at a relative humidity between 70-95% and at room temperature.

What is claimed is:

1. A tip array comprising a plurality of tips fixed to a common substrate layer and a rigid support, the tips and common substrate layer formed from an elastomeric polymer, the elastomeric polymer of the tips having a compression modulus of about 10 MPa to about 300 MPa, each tip having a radius of curvature of less than about 1 µm, and each tip coated with silica having a thickness of 125 nm to 200 nm.

2. The tip array of claim 1, wherein the elastomeric polymer comprises polydimethylsiloxane (PDMS).

3. The tip array of claim 2, wherein the PDMS comprises a trimethylsiloxy terminated vinylmethylsiloxane-dimethysiloxane copolymer, a methylhydrosiloxane-dimethylsiloxane copolymer, or a mixture thereof.

4. The tip array of claim 1, wherein each tip has a radius of curvature of less than about 0.5 µm.

5. The tip array of claim 4, wherein each tip has a radius of curvature of less than 100 nm.

6. The tip array of claim 1, wherein the thickness of the common substrate layer is 50 µm to 100 µm.

7. The tip array of claim 1, wherein the tip array, common substrate layer, and rigid support are at least translucent.

8. The tip array of claim 1, wherein the common substrate layer and tips have a combined thickness of less than 200 μm.

9. The tip array of claim 1, wherein the silica coating has a thickness of about 150 nm to about 175 nm.

10. The tip array of claim 1, wherein the elastomeric polymer comprises a methylchlorosilane, an ethylchlorosilane, a phenylchlorosilane, polydimethylsiloxane, polyethylene, polystyrene, polybutadiene, polyurethane, polyisoprene, polyacrylic rubber, fluorosilicone rubber, fluoroelastomer, or a combination thereof.

11. The tip array of claim 1, having greater than 1 million tips.

12. The tip array of claim 1, wherein the silica coating has a thickness of about 150 nm to about 175 nm and the common substrate layer and tips have a combined thickness of less than 200 μm.

13. The tip array of claim 1, wherein the rigid support comprises glass.

14. A method for sub-micron scale printing of indicia on a substrate surface, comprising:
    coating the tip array of claim 1 with a patterning composition;
    contacting the substrate surface for a first contacting period of time and at a first contacting pressure with all or substantially all of the coated tips of the array to deposit the patterning composition onto the substrate surface and form substantially uniform indicia with all or substantially all of said coated tips, the indicia having a dot size (or line width) of less than 1 μm.

15. The method of claim 14, further comprising tilting the tip array relative to the substrate surface such that the size of the resulting indicia varies across the substrate surface.

16. The method of claim 14, wherein the indicia have a feature pitch of 190 nm to 500 nm.

17. The method of claim 14, wherein the patterning composition comprises a polymer and the indicia comprise the polymer.

18. The method of claim 14, wherein the indicia size is independent of the contact force.

19. A method of making the tip array of claim 1, comprising:
    coating the tips of an elastomeric polymeric tip array with silica by plasma-enhanced chemical vapor deposition (PECVD) to form a silica coat on the tips having a thickness of 125 nm to 200 nm.

20. The method of claim 15, wherein the PECVD is performed at a temperature of 200° C. and a pressure of 900 mTorr.

* * * * *

UNITED STATES PATENT AND TRADEMARK OFFICE
CERTIFICATE OF CORRECTION

PATENT NO. : 9,971,239 B2
APPLICATION NO. : 15/299565
DATED : May 15, 2018
INVENTOR(S) : Chad A. Mirkin et al.

It is certified that error appears in the above-identified patent and that said Letters Patent is hereby corrected as shown below:

In the Claims

At Column 16, Line 22, "claim 15," should be -- claim 19, --.

Signed and Sealed this
Eleventh Day of December, 2018

Andrei Iancu
*Director of the United States Patent and Trademark Office*